(12) United States Patent
Taheri et al.

(10) Patent No.: US 10,310,349 B2
(45) Date of Patent: Jun. 4, 2019

(54) VARIABLE LIGHT ATTENUATING DEVICES AND ARRANGEMENTS

(71) Applicant: ALPHAMICRON INCORPORATED, Kent, OH (US)

(72) Inventors: Bahman Taheri, Shaker Heights, OH (US); Tamas Kosa, Hudson, OH (US); Christine Baker, Cuyahoga Falls, OH (US); Volodymyr Bodnar, Kent, OH (US)

(73) Assignee: ALPHAMICRON INCORPORATED, Kent, OH (US)

( * ) Notice: Subject to any disclaimer, the term of this patent is extended or adjusted under 35 U.S.C. 154(b) by 125 days.

(21) Appl. No.: 14/804,409

(22) Filed: Jul. 21, 2015

(65) Prior Publication Data

US 2015/0323825 A1 Nov. 12, 2015

Related U.S. Application Data

(63) Continuation-in-part of application No. 13/265,948, filed as application No. PCT/US2010/032396 on Apr. 26, 2010, now Pat. No. 9,130,097.

(Continued)

(51) Int. Cl.
*H01L 31/055* (2014.01)
*H01L 31/054* (2014.01)
(Continued)

(52) U.S. Cl.
CPC ............ *G02F 1/13762* (2013.01); *E06B 9/24* (2013.01); *E06B 9/264* (2013.01);
(Continued)

(58) Field of Classification Search
CPC ....... G02F 1/13725; G02F 2001/13706; G02F 1/137; G02F 1/13731
See application file for complete search history.

(56) References Cited

U.S. PATENT DOCUMENTS

| 3,864,022 A | 2/1975 | Moriyama et al. ............. 349/35 |
| 4,919,520 A | 4/1990 | Okada et al. |

(Continued)

FOREIGN PATENT DOCUMENTS

| JP | 62-118316 | 11/1985 | ............... G02C 7/10 |
| JP | 11-160659 | 6/1999 | |

(Continued)

OTHER PUBLICATIONS

*Luminescent Solar Concentrators—A review of recent results*; van Sark; Optics Express; Optical Society of America; vol. 16, No. 26; Dec. 22, 2008; pp. 21773-21792.

(Continued)

*Primary Examiner* — Jessica M Merlin
(74) *Attorney, Agent, or Firm* — Renner Kenner Greive Bobak Taylor & Weber

(57) ABSTRACT

A non-polarizer based variable light attenuating device includes a guest-host solution having a liquid crystal host and a guest dichroic dye disposed between first and second conducting layers provided on first and second transparent substrates. The guest-host solution has a low-haze while the guest dye orientation alters between a low light transmitting orientation and a high light transmitting orientation in response to a first voltage supplied to the first and second conducting layers. In response to a second voltage supplied to the first and second conducting layers, the guest-host solution changes to a focal conic light scattering orientation to achieve a high-haze translucent state.

22 Claims, 8 Drawing Sheets

Related U.S. Application Data

(60) Provisional application No. 61/172,455, filed on Apr. 24, 2009.

(51) Int. Cl.

| | | |
|---|---|---|
| *G02F 1/137* | (2006.01) | |
| *G02F 1/133* | (2006.01) | |
| *E06B 9/24* | (2006.01) | |
| *E06B 9/264* | (2006.01) | |

(52) U.S. Cl.
CPC ...... *G02F 1/13306* (2013.01); *G02F 1/13737* (2013.01); *H01L 31/055* (2013.01); *H01L 31/0547* (2014.12); *E06B 2009/2464* (2013.01); *E06B 2009/2476* (2013.01); *E06B 2009/2643* (2013.01); *G02F 2001/13324* (2013.01); *G02F 2001/13706* (2013.01); *G02F 2202/046* (2013.01); *G02F 2203/48* (2013.01); *Y02E 10/52* (2013.01)

(56) References Cited

U.S. PATENT DOCUMENTS

| | | | | |
|---|---|---|---|---|
| 5,172,256 | A | 12/1992 | Sethofer et al. | |
| 5,343,313 | A | 8/1994 | Fergason | |
| 5,453,863 | A * | 9/1995 | West | C09K 19/02 349/180 |
| 5,943,104 | A * | 8/1999 | Moddel | G02C 7/101 349/120 |
| 6,493,128 | B1 | 12/2002 | Agrawal et al. | |
| 6,674,504 | B1 * | 1/2004 | Li | C09K 19/544 349/169 |
| 6,753,047 | B1 | 6/2004 | Athey | 428/1.21 |
| 7,356,969 | B1 | 4/2008 | Yurth et al. | 52/171.3 |
| 2004/0070699 | A1 * | 4/2004 | Miyachi | G02F 1/133711 349/43 |
| 2004/0125305 | A1 * | 7/2004 | Nishi | G02F 1/134363 349/141 |
| 2005/0007506 | A1 | 1/2005 | Faris et al. | |
| 2006/0152649 | A1 * | 7/2006 | Yanagida | H04N 5/2254 349/61 |
| 2007/0146910 | A1 | 6/2007 | Duston et al. | 359/834 |
| 2007/0151600 | A1 | 7/2007 | Li et al. | |
| 2007/0153354 | A1 * | 7/2007 | Duston | F24J 2/06 359/245 |
| 2007/0268427 | A1 | 11/2007 | Uehara | 349/62 |
| 2008/0013000 | A1 | 1/2008 | Park et al. | |
| 2008/0231785 | A1 * | 9/2008 | Harada | C09K 19/32 349/123 |
| 2009/0027872 | A1 | 1/2009 | Debije et al. | 362/84 |
| 2009/0114211 | A1 | 5/2009 | Homyk et al. | 126/578 |
| 2009/0204207 | A1 | 8/2009 | Blum et al. | 623/4.1 |
| 2010/0024805 | A1 | 2/2010 | Raymond et al. | 126/683 |
| 2010/0225837 | A1 * | 9/2010 | Seki | G02F 1/135 349/25 |

FOREIGN PATENT DOCUMENTS

| | | | | |
|---|---|---|---|---|
| WO | WO 99/67681 | 12/1999 | ............. | G02F 1/139 |
| WO | WO 00/27771 | 5/2000 | ............. | C03C 17/34 |
| WO | WO 2006/088369 A2 | 8/2006 | ........... | H01L 31/055 |
| WO | WO 2008/075286 | 6/2008 | | |
| WO | WO 2008/155767 A2 | 12/2008 | ............... | G02B 5/20 |
| WO | WO 2009/141295 A1 | 11/2009 | ......... | H01L 31/0256 |

OTHER PUBLICATIONS

*Introduction to Modern Optics*; Fowles, Grant R., Professor of Physics; University of Utah; Second Edition, Dover Publications, Inc., 1975, New York; 3 pages.
4ed OPTICS 4th Edition; Hecht, Eugene; Adelphi University, A.R. Ganesan, India Institute of Technology Madras, Pearson Eduction, Inc., 2002; 11 pages.
*MIT opens new "window" on solar energy*; Thomson, Elizabeth A.; Jul. 10, 2008; http://www.mit.edu/newsoffice/2008/solarcells-0710.html.
*High Efficiency Organic Solar Concentrators for Photovoltaics*; Currie et al.,; Science, vol. 321; Jul. 11, 2008, pp. 226-228.
*MIT Brainstorms Alternative Energies*; Photonics Spectra; Oct. 2008; pp. 46-47.
International Search Report for International Application No. PCT/US2010/022723 dated Mar. 16, 2010.
Written Opinion for International Application No. PCT/US2010/022723 dated Mar. 16, 2010.
International Preliminary Report on Patentability for International Application No. PCT/US2010/022723 dated Aug. 2, 2011.
International Search Report for International Application No. PCT/US2010/32396 dated Jun. 10, 2010.
Written Opinion for International Application No. PCT/US2010/32396 dated Jun. 10, 2010.
International Preliminary Report on Patentability for International Application No. PCT/US2010/032396 dated Oct. 25, 2011.
European Search and Examination Report dated Aug. 25, 2014 in related application No. EP 10 76 7883.
Office Action dated Apr. 13, 2012 in related U.S. Appl. No. 13/265,948.
Response as filed Jul. 12, 2012 in related U.S. Appl. No. 13/265,948.
Office Action dated Sep. 14, 2012 in related U.S. Appl. No. 13/265,948.
Response as filed Feb. 14, 2013 in related U.S. Appl. No. 13/265,948.
Final Office Action dated May 17, 2013 in related U.S. Appl. No. 13/265,948.
Response as filed Oct. 17, 2013 in related U.S. Appl. No. 13/265,948.
Office Action dated Jul. 23, 2014 in related U.S. Appl. No. 13/265,948.
Response as filed Nov. 24, 2014 in related U.S. Appl. No. 13/265,948.
Final Office Action dated Mar. 2, 2015 in related U.S. Appl. No. 13/265,948.
Response as filed Mar. 12, 2015 in related U.S. Appl. No. 13/265,948.
Notice of Allowance dated Mar. 30, 2015 in related U.S. Appl. No. 13/265,948.
Supplemental Notice of Allowance dated Aug. 6, 2015 in related U.S. Appl. No. 13/265,948.
Examination Report dated Aug. 20, 2015 in related application No. 10 767 883.1.

* cited by examiner

VARIABLE LIGHT ATTENUATING DEVICES AND ARRANGEMENTS

CROSS-REFERENCE TO RELATED APPLICATIONS

This application is a continuation-in-part of U.S. patent application Ser. No. 13/265,948, filed Oct. 24, 2011, and claims priority to, and any other benefit of, PCT Application No. PCT/US2010/032396 filed Apr. 26, 2010, and U.S. Provisional Patent Application Ser. No. 61/172,455, filed Apr. 24, 2009, both entitled SOLAR POWERED VARIABLE LIGHT ATTENUATING DEVICES AND ARRANGEMENTS, the entire disclosures of which are fully incorporated herein by reference.

BACKGROUND

Windows, such as those used in commercial and residential buildings, have long been a source of energy loss and are therefore associated with significantly increased energy costs. Despite efforts in the last three decades to reduce energy costs associated with windows, an estimated 2.7 quadrillion BTU's of energy utilized to heat and cool buildings in the United States in 2006 (out of estimated total of 10 quadrillion BTU's expended) were attributable to windows, an amount roughly equivalent to the nation's entire Strategic Petroleum Reserve. Energy inefficiencies associated with windows include heat loss through the window in cold weather, heat gain through the window in hot weather, or both.

Many technologies that reduce energy losses from windows have developed in the past few years. For example, today's windows can employ multiple glazing, high-tech materials like aerogel between the glazing, and low-emissivity (low-E) coatings to minimize heat loss. There are also coatings that are much more reflective of infrared light than visible light. However, even windows which employ all these advances have significant energy losses. This is because they are designed for single climate use and cannot adapt to changing weather conditions.

Accordingly, there remains a need for variable light attenuating devices, such as windows, that have the ability to reduce the amount of light transmission through the window at various times. It is also desirable to be able to provide a "privacy" mode, where the window is translucent or "frosted" in appearance. Therefore, there is a need for a device with variable light absorption, light transmission and light scattering states that can be controlled according to need.

SUMMARY

The present application contemplates devices, arrangements and methods for providing variable light attenuation through an optical device, such as, for example, a window, screen, visor, glasses, goggles or other such device. According to one inventive aspect of the present application, a variable light attenuating device may be configured to be solar powered, such that use of an external power source may be reduced or eliminated while providing energy efficiency and other benefits associated with automatic and/or selective variable attenuating or tinting of the optical device, either to a transparent (or low haze) condition or to a translucent (or high haze) condition.

In one embodiment, a non-polarizer based variable light attenuating device is capable of transitioning between three states: a clear (minimal light absorption and minimal haze) state, a dark (maximal light absorption while having low-haze) state and a translucent (light scattering) state. The device includes first and second conducting layers provided on first and second transparent substrates and a guest-host solution disposed between the first and second conducting layers. The guest-host solution includes a liquid crystal host and a guest dichroic dye. The liquid crystal-dye orientation alters between a low-haze low light transmitting orientation and a low-haze high light transmitting orientation in response to a first voltage supplied to the first and second conducting layers. Further, the liquid crystal-dye is arranged in a droplet-sized light scattering orientation in response to a second voltage supplied to the first and second conducting layers.

In some examples, the liquid crystal-dye is substantially perpendicular to the first and second substrates when no voltage is supplied to the conducting layers and substantially parallel to the first and second substrates when the first voltage is supplied to the conducting layers.

In other example, the dye is substantially parallel to the first and second substrates when no voltage is supplied to the conducting layers and substantially perpendicular to the first and second substrates when the first voltage is supplied to the conducting layers.

The device may include a control circuit for supplying a variable voltage to the first and second conducting layers. It can also include a user interface to give a user complete or partial control over light transmittance through the device.

In some examples, the device further includes a photovoltaic cell configured to generate a voltage in response to light detected by the photovoltaic cell.

The control circuit can performs various tasks, including one or more of the following: (a) control the first voltage to vary light transmission through the device automatically, in response to user manipulation of the control circuit, or a combination thereof; (b) control the second voltage to vary light diffusion through the device automatically, in response to user manipulation of the control circuit, or a combination thereof; (c) set a threshold level for supplying the first voltage automatically or as set by a user; or (d) set a threshold level for supplying the second voltage automatically or as set by a user. The automatic control of light transmittance can be either in response to a photovoltaic cell generated voltage, or as a result of a pre-programmed sequence of steps or an algorithm.

In some embodiments, at least one transparent substrate includes a luminescent dye that can absorb light at a first wavelength and emit light at a second wavelength different than the first wavelength.

In some embodiments, the guest-host solution can further include a luminescent dye that absorbs light at a first wavelength and emits light at a second wavelength different than the first wavelength.

In some examples, the guest-host mixture includes a positive dielectric anisotropy chiral liquid crystal host, a dichroic dye guest having positive dichroism, a polymerizable material and an initiator. Also, at least one of the transparent substrates can include a planar alignment layer.

In some embodiments, the chiral liquid crystal has a pitch longer than 850 nm.

In certain examples, the device (in a low-haze state) has a low-haze value that is equal to or less than 15% (when the device is in a low-haze state).

In some examples, the device (when in a high-haze state) has a high-haze value that is higher than 15%.

Some embodiments include a non-polarizer based variable light attenuating device having a liquid crystal cell that has first and second conducting layers provided on first and second transparent substrates and a guest-host mixture disposed between the conducting layers. In this case, the guest-host mixture is in: (i) a low-haze low light-transmitting state when no voltage is applied to the cell; (ii) a low-haze high light-transmitting state when a first voltage is applied to the cell; and (iii) a focal conic light diffusing state to achieve high-haze when a second voltage is applied to the cell.

In some examples, the guest-host mixture includes a positive dielectric anisotropy chiral liquid crystal host, a dichroic dye guest having positive dichroism, a polymerizable material and an initiator. Also, at least one of the transparent substrates has a planar alignment layer.

Another embodiment of the non-polarizer based variable light attenuating device includes a liquid crystal cell having a guest-host mixture disposed between first and second conducting layers provided on first and second transparent substrates. At least one transparent substrate includes a planar alignment layer and the guest-host mixture includes a positive dielectric anisotropy chiral liquid crystal host, a dichroic dye guest having positive dichroism, a polymerizable material and an initiator. The device is configures so that in the absence of a voltage, the liquid crystal host has a planar-helical orientation with minimal light scattering and the cell is in a low-haze high light-absorption (dark) state; in response to a first voltage applied to the cell, the liquid crystal has a light scarring focal conic orientation and the cell is in a high-haze state; and in response to a second voltage applied to the cell, the liquid crystal has a homeotropic orientation with minimal light scattering and the cell is in a low-haze low-light absorption (clear) state.

Solar powered embodiments include a solar powered variable light attenuating device includes a non-polarizer based variable light attenuating liquid crystal cell, at least one photovoltaic cell in electrical communication with the liquid crystal cell, and a light concentrator having a light absorbing surface and a light emitting surface optically coupled to the photovoltaic cell. The light concentrator is configured so that at least a portion of light impinging on its light absorbing surface is concentrated and directed through its light emitting surface to a photon-absorbing portion of the photovoltaic cell to generate a voltage. The photovoltaic cell generated voltage is used to change the liquid crystal cell from a de-energized state to an energized state in response to sunlight directed toward the photovoltaic cell.

In another exemplary embodiment, a solar powered variable light attenuating device includes an electrically operable light attenuating layer; a light concentrating layer having a light absorbing surface and a light emitting surface; and at least one photovoltaic cell optically coupled to the light emitting surface of the light concentrating layer, such that at least a portion of light impinging on the light absorbing surface of the light concentrating layer is directed through the light emitting surface toward a photon-absorbing (active) portion of the photovoltaic cell. When activated, the photovoltaic cell provides an electric potential that powers the electrically operable light attenuating layer to change it from a de-energized high transmission state to an energized low transmission state.

In still another exemplary embodiment, a solar powered variable light attenuating device includes at least one photovoltaic cell and a film having first and second conducting layers in electrical communication with the photovoltaic cell through drive circuitry, and a first dye disposed in a host solution disposed between the first and second conducting layers. The first dye is configured to be disposed in a high light transmitting orientation when the photovoltaic cell is not supplying power to the first and second conductive layers, and is further being configured to be disposed in a low light transmitting orientation when the photovoltaic cell is supplying power to the first and second conductive layers. The film further includes a second dye configured to absorb at least a first portion of light impinging on the film and emit a generated light partially toward the photovoltaic cell. The dye may be disposed in the host solution, or disposed in one or both opposed substrates separating the guest-host solution of the film.

In yet another exemplary embodiment, a variable light attenuating device includes first and second conducting layers, a liquid crystal host solution and a guest dye dispersed therethrough to form a guest-host solution disposed between the first and second conducting layers, and a control circuit configured to supply a variable voltage to the conducting layers. The dye is configured to be disposed in a high light transmitting transparent (low haze) orientation when the power circuit is not supplying a voltage to the conducting layers and in a low light transmitting transparent (low haze) orientation when the power circuit is supplying a first driving form (e.g., a first voltage) to the first and second conducting layers. The dye is further configured to be disposed in a light diffusing translucent (high haze) orientation when the power circuit is supplying a second driving form or voltage to the first and second conducting layers.

In yet another exemplary embodiment, a variable light attenuating device includes first and second conducting layers, a liquid crystal host solution and a guest dye dispersed therethrough to form a guest-host solution disposed between the first and second conducting layers, and a control circuit configured to supply a variable voltage to the conducting layers. The dye is configured to be disposed in a low light transmitting transparent (low haze) orientation when the power circuit is not supplying a voltage to the conducting layers and in a high light transmitting transparent (low haze) orientation when the power circuit is supplying a first driving form or voltage to the first and second conducting layers. The dye is further configured to be disposed in a light diffusing translucent (high haze) orientation when the power circuit is supplying a second driving form or voltage to the first and second conducting layers.

In another exemplary embodiment, a solar powered variable light attenuating device includes an electrically operable light attenuating layer and at least one photovoltaic cell optically coupled to the light attenuating layer, such that at least a first portion of light impinging on an outer surface of the light attenuating layer is directed toward a photon-absorbing portion of the photovoltaic cell inward of the outer surface of the light attenuating layer. The photovoltaic cell is in electrical communication with the electrically operable light attenuating layer and is configured to supply power to change the electrically operable light attenuating layer from a de-energized high transmission state to an energized low transmission state.

Also disclosed are methods of varying light transmittance through an optical element using the devices described above, in one aspect, the optical device includes a non-polarizer based variable light attenuating liquid crystal cell; at least one photovoltaic cell electrically connected to said liquid crystal cell; and a light concentrator having a light absorbing surface and a light emitting surface optically coupled to the photovoltaic cell. The method includes the steps of: directing at least a portion of sunlight impinging on the light absorbing surface of the light concentrator through the light emitting surface to a photon-absorbing portion of the photovoltaic cell to generate a voltage; and using the generated voltage to change the liquid crystal cell from a de-energized high transmission state to an energized low transmission state in response to sunlight directed toward the photovoltaic cell.

BRIEF DESCRIPTION OF THE DRAWINGS

Features and advantages of the invention will become apparent from the following detailed description made with reference to the accompanying drawings, wherein.

DETAILED DESCRIPTION OF THE DISCLOSURE

Figure 1:
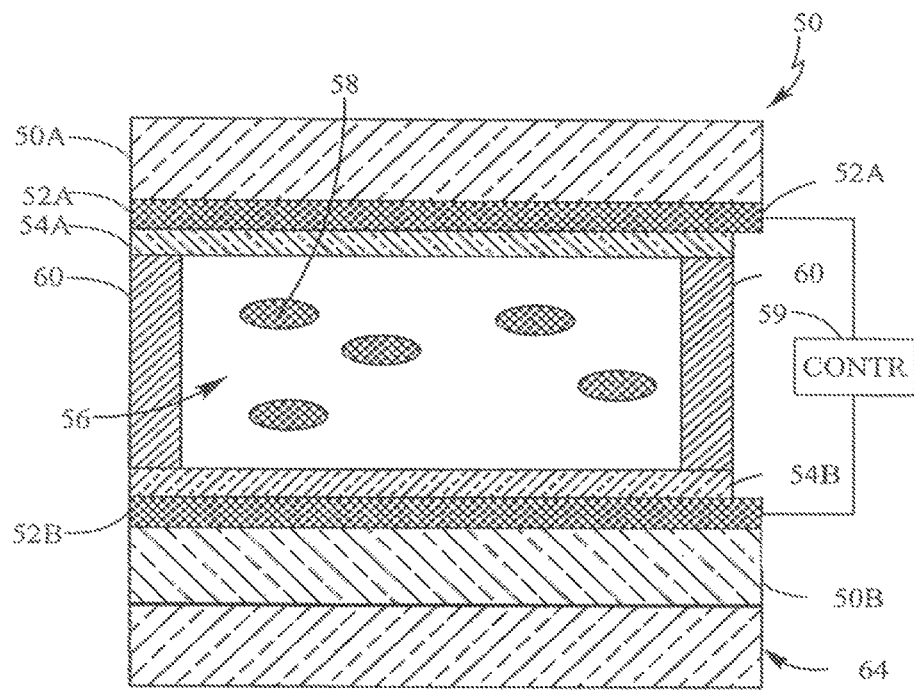
FIG. 1 is an elevational, cross-sectional schematic view of an exemplary liquid crystal cell for use in an electro-optic device.

The structures shown schematically in the drawings have parts that are examples of the elements recited in the apparatus claims. The illustrated structures thus include examples of how a person of ordinary skill in the art can make and use the claimed invention. It is described here to meet the enablement and best mode requirements of the patent statute without imposing limitations that are not recited in the claims. Further, this Detailed Description merely describes exemplary embodiments of the invention and is not intended to limit the scope of the claims in any way. Indeed, the invention as claimed is broader than and unlimited by the preferred embodiments, and the terms used in the claims have their full ordinary meaning.

The present application contemplates devices, methods and arrangements for efficiently controlling an amount of light transmission (or light absorption/reflection or scattering) by an optical device (e.g., a window, visor, or other such light transmitting component), for example, to provide a desired amount of illumination or to permit or reduce solar heating (e.g., in a building).

Accordingly, one embodiment of the invention provides for a variable light attenuating device that is capable of transitioning between three states: a clear (minimal light absorption, low-haze) state, a dark (maximal light absorption, low-haze) state and a translucent (light scattering or high-haze) state. The device includes first and second conducting layers provided on first and second transparent substrates and a guest-host solution disposed between the first and second conducting layers. The guest-host solution includes a liquid crystal host and a guest dichroic dye. The liquid crystal-dye orientation alters between a low-haze low light transmitting orientation and a low-haze high light transmitting orientation in response to a first voltage supplied to the first and second conducting layers. Further, the liquid crystal-dye is arranged in a droplet-sized light scattering orientation in response to a second voltage supplied to the first and second conducting layers.

In another embodiment of the invention, a solar powered variable light attenuating device includes a non-polarizer based variable light attenuating liquid crystal cell and at least one photovoltaic (solar) cell in electrical communication with the liquid crystal cell through a control circuit. When light impinges on the photovoltaic cell, it generates a potential to drive the liquid crystal cell to change from a de-energized state to an energized state. The device can provide rapid response time upon energization and de-energization, ranging for example from less than 1 second to less than 100 milliseconds.

In some embodiments, the device also includes a light-concentrating layer optically coupled to the photovoltaic cell, such that a portion of light impinging on the light absorbing surface of the light concentrator is concentrated and directed toward a light emitting surface of the light concentrator towards a photon(light)-absorbing (active) portion of the photovoltaic cell to generate the potential required to drive the liquid crystal cell. One such arrangement allows for placement of the photovoltaic cells in an array around the periphery of the device with the photon-absorbing (active) portions of the photovoltaic cells facing the edge surfaces of the device. It can also increase the efficiency of the arrangement due to the light concentrating properties of the light concentrator layer (described in detail below).

In some embodiments the devices described herein may include a control circuit that can be configured to serve various functions. One function is to convert the photovoltaic generated direct current (DC) to an alternating current (AC) for operating the liquid crystal cell. It can optionally include a battery-type storage unit to store the energy generated by the photovoltaic cell for later use, either to power the liquid crystal cell or some other device. The control circuit can also include an external power supply if necessary, e.g. when the power supplied by the photovoltaic cell is not sufficient. The control circuit may be configured to automatically control the transmittance of light through the liquid crystal cell, for example in response to the voltage or current generated by the photovoltaic cell, which itself is a function of the amount of outside light detected by the photovoltaic cell. In other examples, the automatic control of light transmission can occur in response to a pre-programmed algorithm, or a pre-determined sequence. Alternatively, or in addition, the control circuit may include a user interface to give the user complete or partial control over the amount of light transmittance (e.g. tinting or scattering) of the light attenuating layer, or to provide a combination of the above-described automatic and user control configurations. The control circuit can be configured to control the response of the liquid crystal cell to changes in the output of the photovoltaic cell, and/or to set the threshold level for the energized and/or de-energized states of the liquid crystal cell, either automatically or as set by an end user. The control circuit may include various other components such as a voltage boost circuitry (e.g., a voltage doubler), and a sensor for the ambient light inside a building (for example so that the device does not darken beyond a certain point no matter how bright the sunlight is outside, or to provide other similar adjustments depending on the amount of inside light).

In some embodiments, photovoltaic cells may be utilized to fully power a variable light attenuating device, such that no additional external power (e.g. from an electrical power grid) is needed to operate the device. In some examples, the crystal cell of such devices are clear in a de-energized state and tinted or darkened in an energized state, thereby allowing the use of photovoltaic cells to automatically darken the device in response to greater intensity of sunlight (e.g., to minimize glare or reduce solar overheating) and providing a "fail to clear" condition (e.g., in the absence of sufficient solar power). Because of these advantages, the exemplary dichroic guest-host variable light attenuating liquid crystal cell is capable of providing effective electronically controllable variable transmittance without requiring any external power supply.

In other examples, the device may be dark in a de-energized state and when energized (upon application of different voltages), can change either to a translucent (scattering) or a clear state. Examples of these devices may be useful in applications where it is desired to have a "fail to dark" device (e.g. sunroofs).

The devices described herein may also be used for energy efficiency gains (e.g., reducing transmission of solar radiation into a building during warmer weather, and increasing transmission of solar radiation in colder weather) while avoiding increased energy costs associated with operating the device. Such a device may contribute toward a "Zero-Energy Building" design, in which all energy utilized within the building originates from, or is supplanted by, the generation of renewable energy at the building site. The device may also be used to provide a light-scattering or "privacy" mode as required.

While the present application primarily describes the use variable light attenuating devices for use with building windows (for example, in residential, commercial, industrial, or greenhouse applications), the inventive features described herein may also be applied to other types of light transmitting applications, including, for example, vehicle (including airplane and automotive) windows and sunroofs, glasses, goggles, and helmet visors. Accordingly, such devices may be either manufactured as an integral part of a window, sunroof, etc., or applied to an already existing window/sunroof (as described below). Also, while in some embodiments the application describes the use of photovoltaic or solar cells to power certain variable light attenuating electro-optic devices, such as, for example, a non-polarizer based liquid crystal cell arrangement, the inventive features described herein may also be utilized for generating and storing electrical energy in solar cells for other electrical applications, including, for example, storing energy for conversion to light or thermal energy, or for powering other electronic devices.

The variable light attenuating liquid crystal cell may include mixtures configured to have varying degrees of transmission. The difference between the energized and de-energized state is referred to as transmission adjustment (or "transmission swing"). In some embodiments, the mixture has a transmission swing of 85-5%, or any number therebetween, e.g., 75%-10%, 70%-30%, 60-15%, etc., or some other suitable transmission swing. In some examples, the transmission can vary between a clear transparent state (high light transmission of e.g., 85%, 80%, 75%, 70%, 65%, 60%, 55%, 50% or any number in between) and a darkened or tinted state (low light transmission of e.g., 5%, 10%, 15%, 20%, 25%, 30%, 35%, or 40% or any number in between) with minimal energy usage. The term "dark" as used herein refers to a state with maximal light absorption while maintaining low-haze, whereas the word "tinted" refers to various states with some level of light absorption that is between minimal absorption (clear) and maximal absorption (dark).

The dichroic dyes may be selected to provide a level of transmission that is proportional to the voltage supplied to the conducting layers, such that a greater intensity of light producing a higher voltage will result in either a lower or a higher light transmission level. The dichroic dyes may be selected to provide any desired color, including, for example, neutral, brown, blue and gold, or a combination of such colors to provide any desired hue. The liquid crystal host may be selected to provide large dielectric anisotropy (positive or negative), birefringence tuning, wide operating temperatures, compatibility with various additives, and stability to product specification. Examples of liquid crystal material classes for use in a dichroic guest-host variable light attenuating liquid crystal cell include the MLC-6609 and ZLI-4788 liquid crystal materials from Merck.

Many different production methods may be utilized for manufacturing a film including the dichroic guest-host material liquid crystal cell technology for use with a window or other light transmitting device. In one example, a web-based roll-to-roll system may be utilized to apply and cure (as necessary) each layer or coating, to produce a laminated or plastic film to be applied to the window or other device.

An example of a dichroic guest-host variable light-attenuating liquid crystal cell utilizing dichroic dyes, as contemplated herein, is presented in FIG. 1. The variable light-attenuating liquid crystal cell 50 comprises spaced apart, opposed transparent substrates 50A and 50B, wherein each substrate provides corresponding transparent conducting layers 52A and 52B, which are typically formed from indium tin oxide, conductive polymer or other appropriate conductive material. Conducting layers allow for application of a voltage across a gap between the substrates. The substrates may be, for example, flat, curved, or doubly curved, for use with various shapes of light transmitting components. The material used for the substrates may be glass, or a flexible or rigid plastic material. If required, an alignment layer 54 may be disposed on each conducting layer or just one of the conducting layers. The alignment layers can align the liquid crystal molecules adjacent to the alignment layers, wherein the molecules are part of the liquid crystal material received between the substrates. A gap (of about 1-100 µm, in some examples 5-20 µm) is typically provided between the substrates and may be maintained by spacers (not shown), as is commonly known in the art. Accordingly, the opposed substrates 50A, 50B form a gap 56 which receives a mixture of a liquid crystal or other electro-optic material (such as an electro-chromic material) and dichroic dyes 58.

An edge seal 60 may be provided around or about the outer periphery of the liquid crystal cell 50 so as to retain the liquid crystal-dye mixture material between the substrates. In some embodiments, one or both substrates comprise glass or plastic (e.g. polycarbonate, PET, TAC, or other optical grade polymer material). In other embodiments, a sufficiently rigid carrier 64 may be secured or positioned adjacent one or both substrates 50A, 50B. In one such embodiment, the rigid carrier 64 is provided in polycarbonate or some other optical material for example between 1 and 7 mm in thickness.

Figures 2A, 2B, 2C:
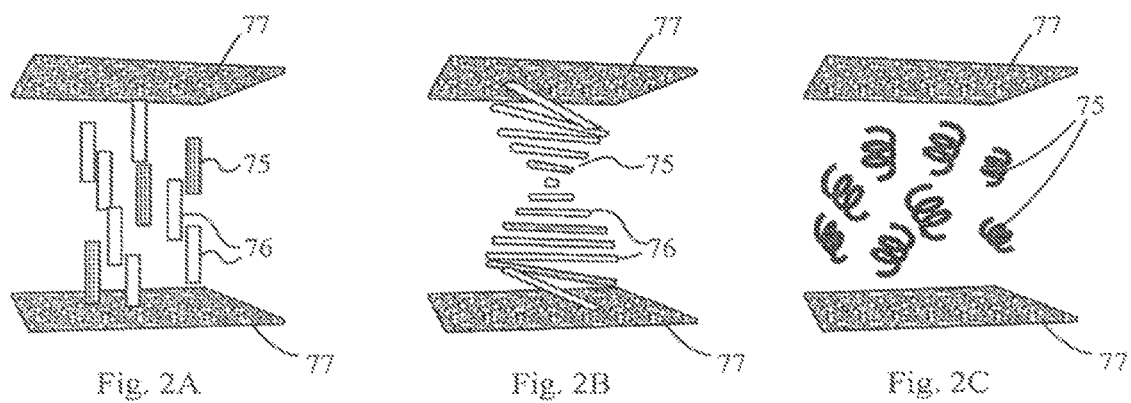
FIG. 2A is a schematic cross-sectional view of an exemplary non-polarizer based liquid crystal device, shown in a de-energized high light transmitting, transparent ("clear") condition.
FIG. 2B is a schematic cross-sectional view of the device of FIG. 2A, shown in an energized low light-transmitting, transparent ("dark") condition.
FIG. 2C is a schematic cross-sectional view of an exemplary non-polarizer based liquid crystal device, shown in an energized light-diffusing translucent condition.

Each conducting layer 52 is connected to a control circuit 59, which typically includes a drive circuit, a power source and an activator. The control circuit applies a voltage and/or voltage waveform in an appropriate manner to change the orientation of the liquid crystal material. By changing the orientation of the liquid crystal material, various optical properties, e.g., absorption, no absorption, high transmission, low transmission, light-scattering (translucent) and states in between, may be obtained. One such example is schematically illustrated in FIGS. 2A and 2B, in which the dichroic dyes 75 and the liquid crystal host material 76 are substantially perpendicular with the substrates 77 in the de-energized condition (FIG. 2A), resulting in maximum light transmission, and substantially parallel with the substrates 77 in the fully energized condition (FIG. 2B), resulting in minimal light transmission due to the dye orientation (in the low-haze state). In a third state, shown in FIG. 2C, the liquid crystal molecules (and dichroic dyes 75) are arranged randomly when in the energized condition, resulting in scattering of light or a translucent state with higher haze. The random arrangement shown in FIG. 2C is known in the art as a "focal conic" texture. Alternatively, the device can be configured by appropriate choice of alignment layer and liquid crystal dielectric anisotropy so that FIG. 2B represents the de-energized state while FIG. 2A demonstrates the energized state. It is also possible to achieve a third state (FIG. 2C) in such an example by altering the amount of voltage applied to the guest-host solution.

For descriptive purposes, the different states of the optical element may be referred to as a "clear" state, where it allows the maximum amount of light through (i.e. low-haze high light-transmitting), or a "dark" state, where it allows the maximum amount of light absorption by the dichroic dyes with minimal or no haze, (i.e. low-haze low light-transmitting or low-haze high light absorption state), or in any state between the fully clear or fully dark states (i.e. "tinted" state where the amount of light absorption is dependent on the amount of applied voltage). The absorption can be broadband (i.e. absorbing across the entire visible spectrum) or across a selected band or region of the visible light spectrum. Additionally or alternatively, the optical element may provide protection against UV light. The terms "low-haze" and "transparent" are used interchangeably. Additionally, as shown in FIG. 2C, a guest-host solution may be configured to provide a translucent or light scattering state (e.g., "frosted" or "privacy glass") in addition to the above described range of transparent states, or instead of the dark state, in response to a separate electrical signal supplied to the conductive layers 77, for example, by supplying a different electrical driving scheme to the conducting layers which causes a droplet-sized orientation of liquid crystal host material 76. In one such embodiment, a control circuit may be configured to supply this different electrical charge (e.g. a second voltage) either automatically or through user manipulation of the control circuit, thereby allowing the user to selectively change the light attenuating device to the translucent state. In the translucent state, light is scattered due to the droplet-sized orientation (i.e. focal conic texturing) of the liquid crystal material, as shown in FIG. 2C, as well as absorbed due to the orientation of the dyes. The terms "high-haze" and "translucent" are used interchangeably.

One noteworthy feature of the variable light-attenuating liquid crystal cell is that the cell does not utilize polarizers, which reduce light transmission of the device in a clear state. In some embodiments, the variable light-attenuating liquid crystal cell used in the optical element is configured so that it reverts to the clear state when there is no voltage applied across the liquid crystals, thus preventing the cell from failing in a tinted or darkened (low transmission) condition. In other embodiments, the cell reverts to a dark state when there is no voltage applied.

Some examples of dichroic guest-host variable light-attenuating liquid crystal cells, and applications utilizing the cells, are described in greater detail in U.S. Pat. Nos. 6,239,778; 6,690,495; and 7,102,602; and in co-pending U.S. Application Pub. No. 2008/0013000, the entire disclosures of which are incorporated herein by reference. Additionally, many different types of dichroic dyes may be utilized in the dichroic guest-host variable light-attenuating liquid crystal cells described herein and in the above incorporated references.

Figures 3, 4:
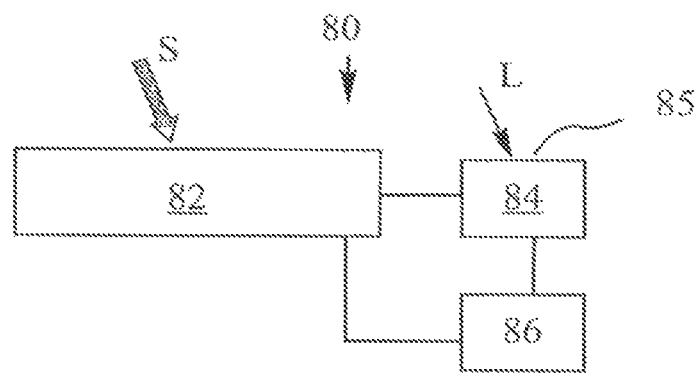
FIG. 3 is a schematic view of an exemplary solar powered variable light attenuating device.
FIG. 4 is a table identifying some examples of luminescent dyes for use with a luminescent concentrator.

FIG. 3 schematically illustrates a solar powered variable light attenuating device 80. As shown, the device 80 includes an electrically operable variable light attenuating layer 82 in electrical communication with one or more photovoltaic cells 84 through a control circuit 86. In one embodiment, the photovoltaic cells 84 may be positioned such that the light or photon-absorbing portions 85 of the photovoltaic cells 84 face outward (i.e., facing the sunlight). In such an embodiment, the photovoltaic cells 84 may be provided on, over, adjacent to, or remote from (but still electrically connected with) the variable light attenuating layer 82 and the control circuit 86. Where the photovoltaic cells 84 are proximate the light attenuating layer 82, the intensity of light L impinging on the photovoltaic cells 84 is generally consistent with the intensity of light S impinging on the light attenuating layer 82. As a result, in conditions of more intense sunlight (i.e., greater potential for excessive glare and/or solar overheating), a greater voltage may be supplied by the photovoltaic cells 84 to the light attenuating layer 82, to energize the light attenuating layer to a low transmission or darkened state. In conditions of low (or no) sunlight, low (or no) voltage is supplied by the photovoltaic cells 84 to the light attenuating layer 82, resulting in a clear (de-energized) or nearly clear (minimally energized) state.

While photovoltaic cells provided with a solar powered variable light transmitting device may be positioned such that photon-absorbing portions of the photovoltaic cells face outward (i.e., facing the sunlight), in other embodiments, according to an inventive aspect of the present application, a solar powered variable light attenuating system may utilize photovoltaic cells configured to collect concentrated solar radiation indirectly, for example, to maximize the collection of solar radiation for conversion to an electrical charge while reducing the light absorbing portion areas of the photovoltaic cells (and the vacuum coating of these surfaces), thereby reducing manufacturing and maintenance costs for the system. As additional benefits of the reduced size and indirect positioning of the solar cells, the solar cells may, for example, be shielded from view or may cover a reduced external surface area of an object or structure utilizing the solar cells, for improved aesthetics or minimized risk of damage to the solar cells, hi one embodiment, a light concentrator may be utilized to concentrate and/or redirect sunlight to a photovoltaic cell having a photon-absorbing portion that does not directly face the sunlight, in one exemplary embodiment, a window or a window attachment may include a light concentrating layer having one or more reflectors (e.g., a light pipe) positioned to direct at least a portion of the impinging sunlight toward one or more photovoltaic cells disposed on or adjacent to the window or window attachment.

In one such embodiment, a light concentrating layer or light concentrator of an optical device may include a luminescent solar concentrator that converts incident sunlight to luminescent radiation at wavelengths that are more compatible with, or more efficiently absorbed by, photovoltaic cells. By "concentrating" or "concentrator," it is meant that a wavelength or wavelengths of light impinging on an area are reflected, re-emitted, or otherwise redirected to a relatively smaller area. This may allow for use of smaller photovoltaic cells, which may provide cost savings, and permit less obtrusive use of the photovoltaic cells (e.g., placement of the photovoltaic cells along the edge of the window or window attachment). While many different luminescent solar concentrators may be utilized, in one embodiment, a light transmitting layer includes luminescent dyes selected to absorb primarily blue-ultraviolet light (wavelength of less than 500 nm) or high energy photons and emit primarily red-infrared light (wavelength greater than 600 nm) or low energy photons for more efficient collection by the photovoltaic cells. By absorbing and emitting radiation that is primarily outside the visible spectrum (400 nm-700 nm), more visible light passes through the layers (little to none is redirected to the photovoltaic cells) and a neutral tint to the window or window attachment may be maintained (i.e., minimizing any luminescent "glow"). In the alternative, some light in the red region may also be directed to the photovoltaic cells to give the window a desirable blue tint.

To assist in directing emitted light toward the photovoltaic cells, the luminescent dyes may be configured to be oriented such that a substantial portion of the emitted luminescent light is directed (or "waveguided") laterally outward toward an edge of the light transmitting layer for collection by the photovoltaic cells. Suitable luminescent dyes are known in the art and can be used in the light concentrator layer. Some examples of luminescent dyes are identified in FIG. 4. Examples of light concentrators are described in U.S. patent application Ser. No. 12/353,459 to Mapel et al., (Publication Number: 2009/0235974).

Figure 5:
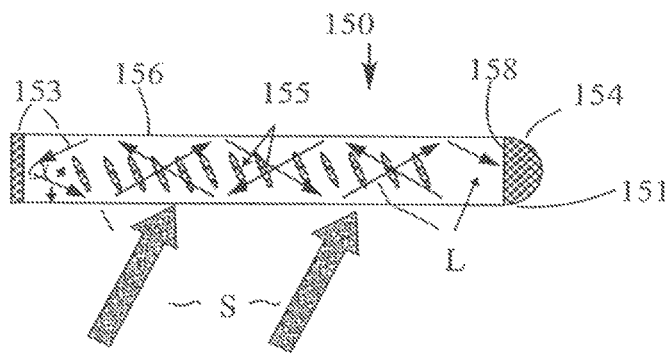
FIG. 5 is a schematic cross-sectional view of an exemplary luminescent concentrator used with one or more photovoltaic cells.

FIG. 5 schematically illustrates a luminescent concentrator 150 for absorbing sunlight through a light absorbing surface and emitting and directing luminescent light L through a light emitting surface and toward one or more photovoltaic cells 154 optically coupled to one or more edges 151 of the concentrator 150. In the illustrated embodiment, the light emitting surface is substantially perpendicular to the light absorbing surface, hi other embodiments, the light emitting surface may be disposed at different angle with respect to the light absorbing surface, including, for example, a coplanar relationship. The exemplary luminescent concentrator includes photoconverting materials, such as luminescent dyes 155 (e.g., phosphorescent or fluorescent dyes), oriented to both absorb solar radiation that passes through its light absorbing surface 156 and emit luminescent light toward its light emitting surface 158 and the photovoltaic cells 154. The luminescent dyes 155 may be selected to include an absorption spectrum primarily in the blue and red region of the spectrum where the human eye is photopically less sensitive to provide a neutral tint to the window (or other light transmitting device). Additionally or alternatively, the luminescent dye may be selected to primarily absorb ultraviolet light, and a small portion of the visible spectrum (e.g., up to about 10%) and emit a red/infrared light, thereby matching a peak efficiency of the solar cells used for power conversion, for more efficient collection by the solar cells, hi the alternative, some light in the red region may also be directed to the photovoltaic cells to give the window a desirable blue tint (e.g., light having a wavelength of >580 is absorbed). The luminescent dye may also be selected for stability, such that it can last several years without degrading or affecting performance. One example is Perylene dyes, which are known for their UV stability, with certain classes of which being warranted to last for ten years by their manufacturer, BASF. Likewise, the arrangement may utilize dye-sensitized photovoltaic cells for more efficient conversion of the luminescent radiation.

Figure 6:
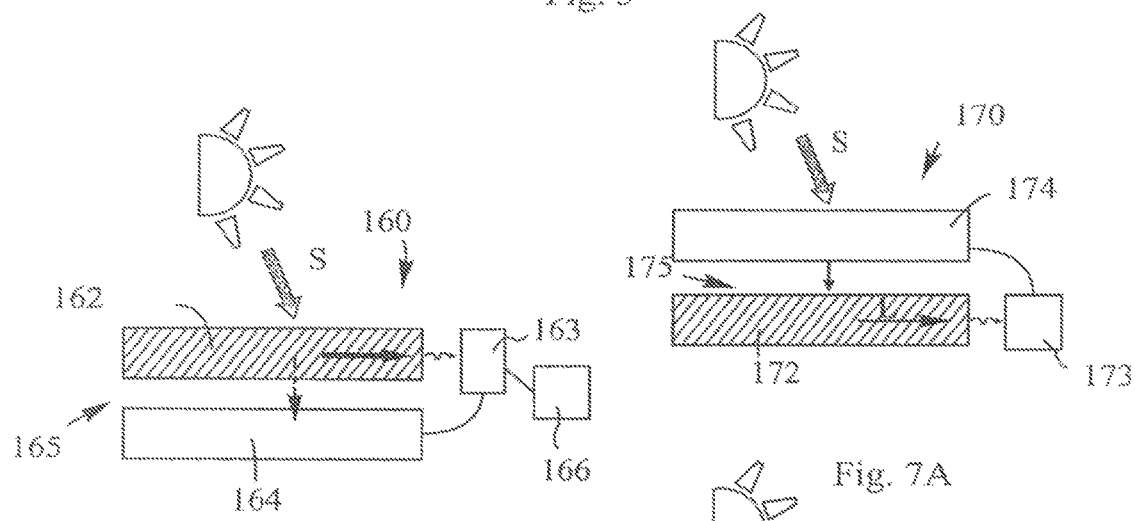
FIG. 6 is a schematic view of an exemplary solar powered variable light attenuating device with a light concentrator.

The luminescent dyes may be distributed in any suitable carrier (e.g., solvents and polymers) to position the dyes for absorbing solar radiation and emitting converted luminescent light. In one embodiment, a liquid crystalline film may be used as a carrier to orient the absorption and emission dipoles of the luminescent dyes for maximum efficiency. The liquid crystal may include low molecular weight materials in a conventional cell configuration. In another embodiment, a polymeric liquid crystal cell may provide waveguiding for the emitted light. In some embodiments, as shown in FIG. 6, a solar powered variable light attenuating device 160 is provided with a film, panel, or other such arrangement 165 having a light attenuating layer 164 optically coupled with a light concentrating layer 162, such that at least a portion of the light impinging on the light concentrating layer 162 also impinges on the light attenuating layer 164. The layers 162, 164 may, but need not, be stacked or positioned adjacent to each other, or may be separated by a gap or by a transparent intermediary component.

In the embodiment illustrated in FIG. 6, the light concentrating layer 162 is positioned outward of the light attenuating layer 164, such that one or more photovoltaic cells 163 optically coupled with the light concentrating layer 162 collect a portion of light that does not pass through the light attenuating layer 164. This may provide for collection of a greater amount of solar energy by the photovoltaic cells, as the amount of solar radiation (including solar radiation converted to luminescent light by luminescent dyes) collected by the photovoltaic cells 163 is not diminished by the light attenuating layer 164. This may allow for collection of solar energy in excess of an amount required to operate the light attenuating layer 164, which may, for example, be stored in one or more battery cells 166 for later use, either in operating the light attenuating layer 164, or in powering one or more other electrically operable devices (such as a user interface, e.g., a display and selectors).

Figure 7A:
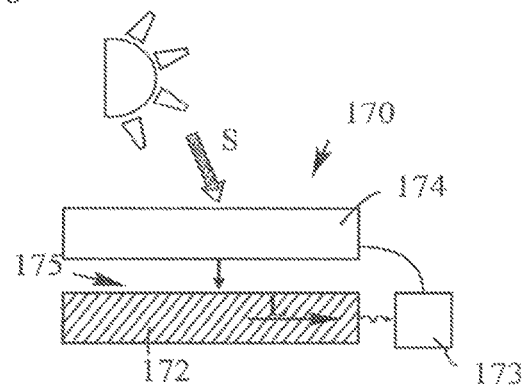
FIG. 7A is a schematic view of another exemplary solar powered variable light attenuating device with a light concentrator.
Figure 7B:
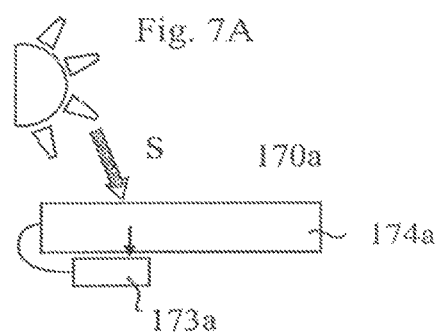
FIG. 7B is a schematic view of an exemplary solar powered variable light attenuating device without a light concentrator.

In another inventive embodiment, as shown in FIG. 7A, a variable light attenuating device 170 may include a light concentrating layer 172 and photovoltaic cells 173 positioned inward of a light attenuating layer 174, such that any light collected by the photovoltaic cells 173 first passes through the light attenuating layer 174. This arrangement may provide for an "equilibrium state" of attenuation that automatically maintains a fixed transmission (i.e., is self-regulating). As the intensity of sunlight S on the light attenuating layer 174 increases, the solar radiation passing through the light attenuating layer 174 to the photovoltaic cells 173 (via the light concentrating layer 172) increases, and the photovoltaic cells 173 may be configured to automatically deliver a voltage to the light attenuating layer 174 to darken the tint (i.e., reduce the transmission of light). As the light attenuating layer 174 darkens, a reduced amount of solar radiation reaches the photovoltaic cells 173, thereby reducing the voltage delivered to the light attenuating layer 174. As a result, the light attenuating layer 174 will reach an equilibrium state at which a desired level of tinting is maintained with minimal fluctuations, and an excessive supply of voltage from the photovoltaic cells to the light attenuating layer is avoided. While the device 170 may include a light concentrating layer 172 for directing concentrated light to the photovoltaic cells 173, in another embodiment, as shown in FIG. 7B, a variable light attenuating device 170a may be provided without a light concentrator, with the photovoltaic cell 173a being positioned inward of the light attenuating layer 174a for direct collection of solar radiation S.

Figure 8A:
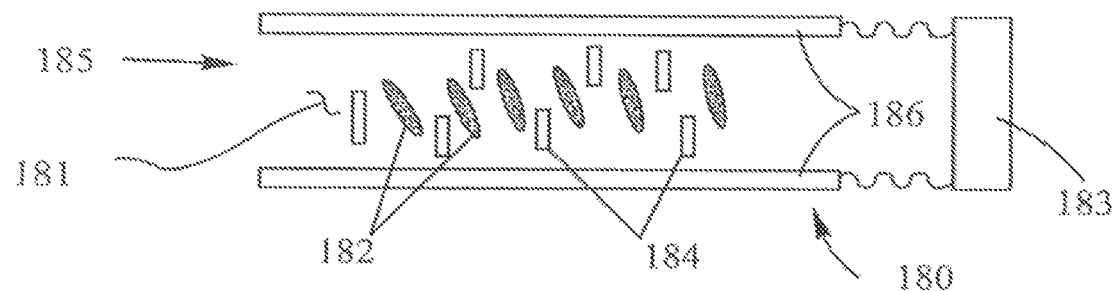
FIG. 8A is a schematic view of an exemplary single layer light concentrating solar powered variable light attenuating device.

In still another embodiment, a light attenuating layer and a light concentrating layer may be replaced by a single layer performing both functions. In one such embodiment, as illustrated in FIG. 8A, a variable light attenuating device 180 may include at least one liquid crystal cell 185 having a host solution 181 with a first set of dyes 182 (e.g., luminescent dyes) for converting and/or directing sunlight (e.g. for absorption by a photovoltaic cell 183), and a second set of dyes 184 (e.g., dichroic dyes) for varying the tint of the device 180 in response to a voltage supplied to first and second conducting layers 186. The luminescent dyes 182 may, but need not necessarily, be configured to change orientation in response to a voltage supplied to the conducting layers 186 separated by the host solution 181.

Figure 8B:
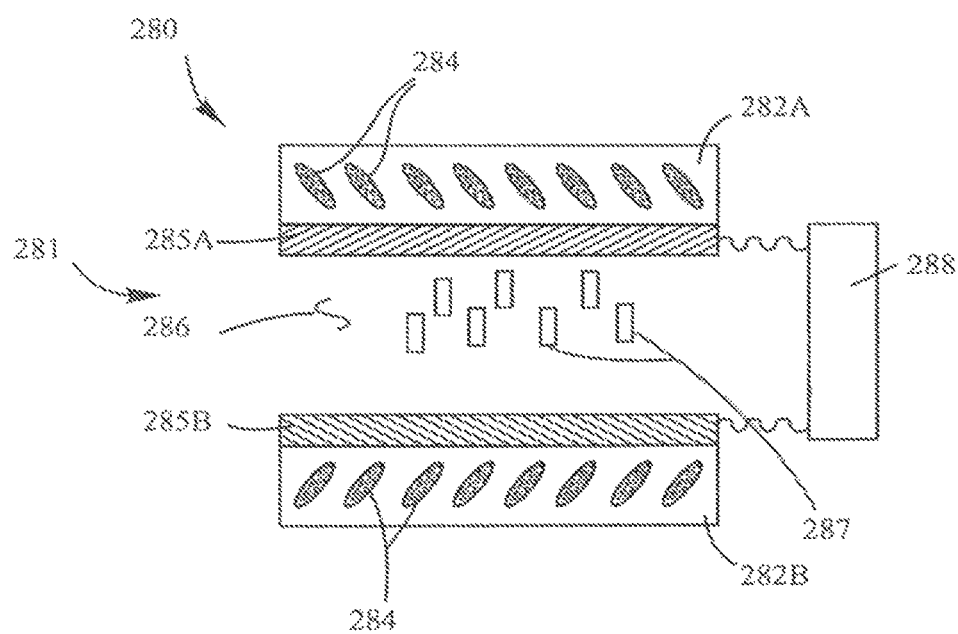
FIG. 8B is an elevational, cross-sectional schematic view of an exemplary liquid crystal cell for use in an electro-optic device.

In another embodiment, a light concentrating layer may be integral to or embedded in one or more of the liquid crystal cell substrates. In an example of this arrangement, illustrated in FIG. 8B, a solar powered variable light attenuating device 280 may include at least one liquid crystal cell 281 having two substrates 282A and 282B, where one or both substrates include or incorporate a first set of dyes 284 (e.g. luminescent dyes). The single liquid crystal cell 281 also includes conducting layers 285A and 285B disposed on each substrate, and a host solution 286 and a second set of dyes 287 (e.g. dichroic dyes) disposed between the two conductive layers 285A and 285B. In this arrangement, the first set of dyes 284 are used for converting and/or directing sunlight (e.g. for absorption by a photovoltaic cell 288). The second set of dyes 287 in the host solution can be configured to change orientation in response to a voltage supplied to the conducting layers 285.

Luminescent dyes provided with a light concentrator may be oriented to optimize both absorption of sunlight and emission of luminescent light toward the photovoltaic cells. This may be done, for example, by dispersing the dye in a liquid crystal film or cell. As shown in FIG. 5, at least some of the luminescent dyes may be oriented at an angle a with respect to the surface of the light transmitting layer (for example, 45°) such that a substantial portion of the emitted luminescent light L is directed (or "waveguided") laterally outward toward the photovoltaic cell(s) 154. In some applications, an orientation of the dyes 155 that is more conducive to emission of luminescent light toward the photovoltaic cells 154 (i.e., approaching parallel with respect the photovoltaic cells 154, or with angle α approaching 90°) may be less conducive to absorption of incident sunlight S by the dyes 155. Conversely, an orientation of the dyes 155 that maybe conducive to absorption of sunlight S by the dyes 155 (i.e., approaching perpendicular with respect the photovoltaic cells 154, or with angle a approaching 0°) may be less conducive to emission of luminescent light L toward the photovoltaic cells 154. In an exemplary embodiment of the present application, the luminescent dyes may be provided in a liquid crystal cell configured to provide a low orientational director for a ground state absorption dipole moment, and a high level of orientational director for its excited state emission dipole moment. To that end, a luminescent dye exhibiting such an asymmetry in the order parameter between the absorption and emission moments may be selected.

Figure 9:
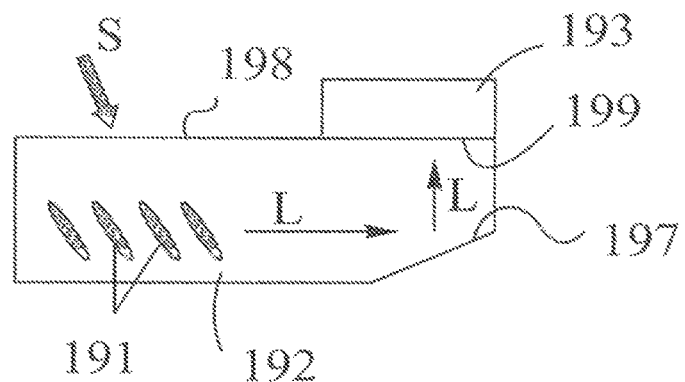
FIG. 9 is a schematic cross-sectional view of an exemplary light concentrator coupled to a photovoltaic cell.

The indirect, concentrated collection of light by the photovoltaic cells, as described above, allows for solar powered variable light attenuating systems in which photon-absorbing portions of the photovoltaic cells face in directions other than outward toward the sunlight (or other light source). As shown in FIG. 5, concentrated solar radiation (including converted luminescent light from luminescent dyes 155) may be reflected or "waveguided" toward one or more edges of the device for collection by one or more photovoltaic cells having light absorbing portions that face the edges of the device. In another embodiment, as shown in FIG. 9, concentrated solar radiation S (including converted luminescent light) may be reflected back outward by a reflector 197 (e.g., an internally reflective surface of a light pipe) toward an outer surface 198 of the light concentrator 192, such that the photovoltaic cells 193 may be positioned with the light absorbing portions 199 facing the outer surface 198 of the light concentrator 192. This may allow the photovoltaic cell 193 to be externally covered or shielded, for example, by a window frame or external wall covering, to improve the aesthetic appearance of the arrangement (e.g., for use with a building window). Various types of reflectors, as known in the art, may be utilized, including, for example, internally reflective light pipes (which may, but need not, provide total internal reflection), which may provide one or more reflective portions for waveguiding or directing the light toward the photovoltaic cells.

Figure 10:
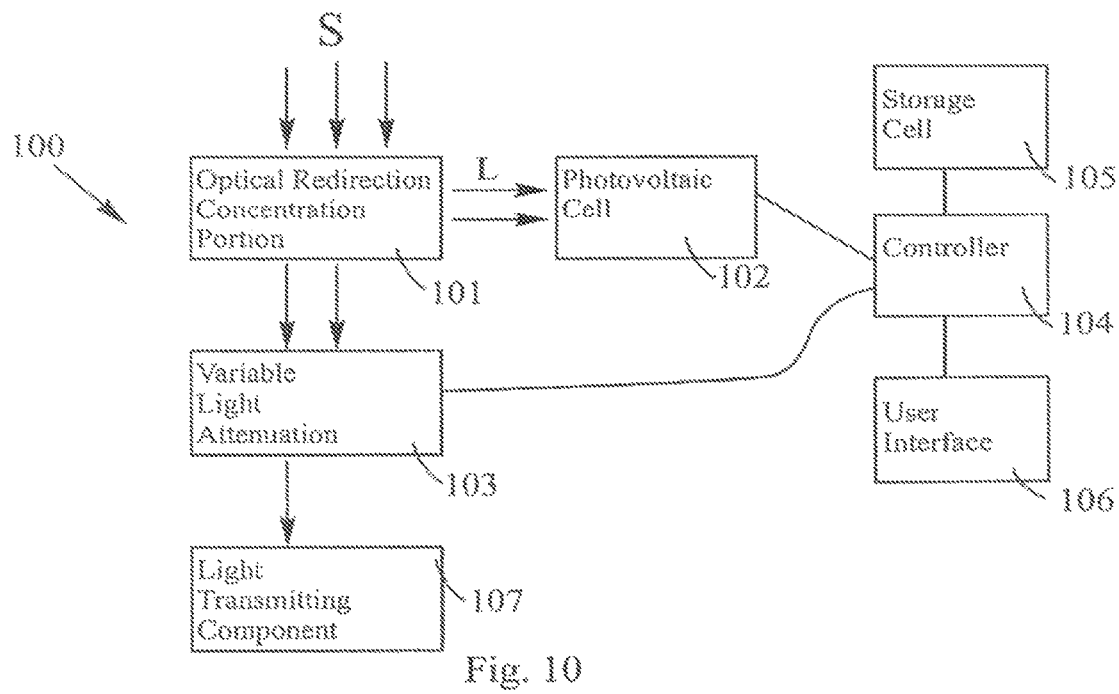
FIG. 10 is a schematic block diagram of an exemplary solar powered variable light attenuating system.

FIG. 10 illustrates a schematic block diagram of an exemplary solar powered variable light attenuating system 100 including an optical redirecting and/or concentrating portion 101 configured to redirect and/or concentrate a portion L of sunlight S for collection by photovoltaic or solar cells 102, with a second portion of the sunlight S being directed toward a variable light attenuator (e.g., liquid crystal cell) 103. The solar cells 102 generate an electrical current from the collected photons or radiation for delivery to a controller 104, which may be configured to selectively or automatically deliver at least a portion of the electrical current to the liquid crystal cell 103 for energization of the liquid crystal cell to produce a darker tint, such that the tinting of the liquid crystal cell 103 may be proportional to the amount or intensity of sunlight S impinging on the optical redirecting and/or concentrating portion 101. In some embodiments, the controller 104 adjusts the optical transmission to the liquid crystal cell 103 by regulating the amount of voltage delivered to the cell (e.g., as applied to the cell electrodes, discussed in greater detail below). Additionally, the system 100 may include a storage cell 105 (e.g., a battery or a so-called super-capacitor) in electrical communication with charging circuitry (not shown) associated with the controller 104 to store at least a portion of the electrical charge generated by the photovoltaic cells 102 (e.g., for later use in powering the liquid crystal cell 103 or other electrically operable devices). Also, the system 100 may further include a user interface 106 in electrical communication with the controller 104 for selective adjustment of the variable light attenuating liquid crystal cell 103, for example, to override the automatic tinting in response to an electrical charge supplied by the photovoltaic cells 102. The system 100 may be configured to be attached to, or to include, a light transmitting component 107, such as, for example, a window glass, lens, or visor.

Figure 11A:
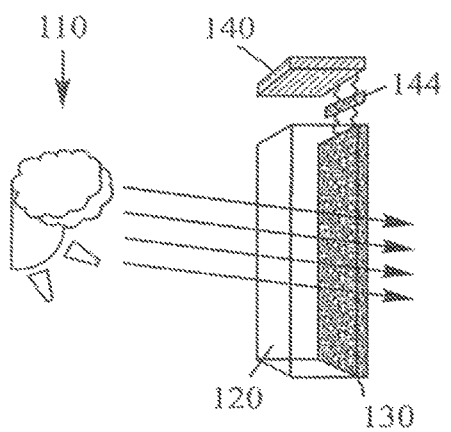
FIG. 11A is a schematic view of a window with a solar powered variable light attenuating tinting arrangement, shown in a low lighting condition.
Figure 11B:
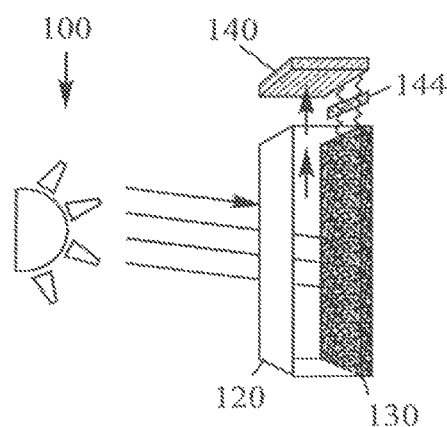
FIG. 11B is a schematic view of the window of FIG. 11A, shown in an intense lighting condition.

Referring now to FIGS. 11A and 11B, an exemplary solar powered light attenuating device 110 includes at least two films 120, 130 or other such layers: a light concentrating outer film 120 ("outer" in the sense that sunlight passes through film 120 before passing through film 130), and an inner film 130 including a variable light attenuating liquid crystal cell inward of an inner surface of the outer film 120. The device further includes one or more photovoltaic cells 140 laterally outward of the outer film 120 and in electrical communication with the liquid crystal cell 130 (for example, using wiring, traces, leads, or other such control circuitry 144). In conditions of low light, as shown in FIG. 11A, the exemplary outer film 120 allows a greater transmission of sunlight S to the liquid crystal cell 30, which in turn permits a greater transmission of sunlight through the de-energized (or minimally energized), and therefore clear or minimally tinted, liquid crystal cell 130. In conditions of intense sunlight, as shown in FIG. 11B, the outer film 120 redirects a portion of the solar radiation toward the photovoltaic cell(s) 140 (e.g., through luminescent converters and/or through reflective portions, as shown in FIGS. 5 and 9). The photovoltaic cell(s) 140 harvest or collect solar radiation to generate an electrical charge. At least a portion of the electrical charge is transmitted (directly or indirectly) to the variable light attenuating liquid crystal cell 130 to energize and darken the liquid crystal cell and reduce light transmission through the window. In some embodiments, the darkened liquid crystal cell 130 may reduce the transmission of sunlight through the panel.

Figure 12A:
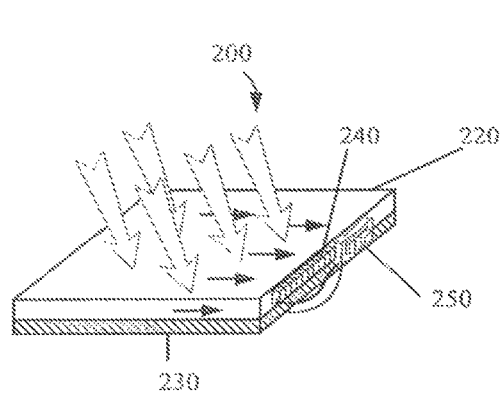
FIGS. 12A and 12B are schematic perspective views of an exemplary solar powered variable light attenuating arrangement.
Figure 12B:
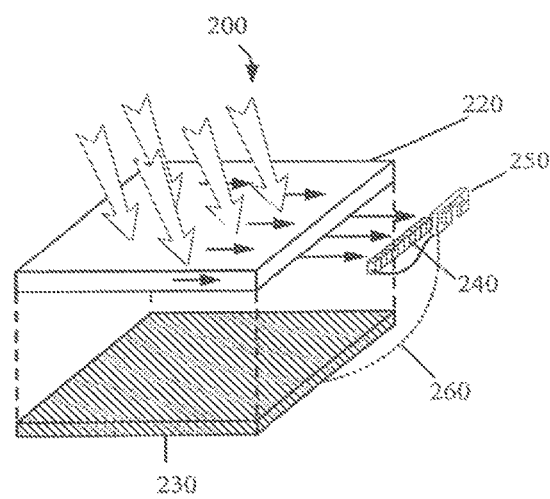

FIGS. 12A and 12B illustrate a schematic example of a solar powered light attenuating device 200 including an outer light concentrating or light piping panel or film 220, a variable light attenuating liquid crystal cell 230, a series of solar cells 240 optically coupled to the edge of the light concentrating layer 220, and a control circuit 250 electrically connecting the solar cells 240 to the liquid crystal layer 230. While the control circuit 250 may be positioned in any suitable location on or near the window arrangement 200, in the illustrated example, the control circuit 250 is secured to adjacent edges of the light piping layer 220 and the liquid crystal cell 230. The control circuit 250 may convert direct current (DC) supplied by the photovoltaic cells 240 to an alternating current (AC) signal (for example, to avoid charge migration) to be supplied to the liquid crystal cell 230. In one example, the control circuit 250 may include a low frequency square wave generator, which may operate with as few as three surface mount low profile components, such as an astable multivibrator with a resistor and a capacitor for frequency settings. Additionally, a user operable controller (not shown) may be electrically connected to the control circuit 250 for selective control of the liquid crystal cell 230, for example, to override an automatic tinting (or un-tinting) of the liquid crystal cell.

Many different types of photovoltaic (solar) cells may be utilized with a window or window attachment to indirectly collect solar and/or luminescent radiation. As one example, vertical multi junction (VMJ) solar cells may provide a relatively high voltage output with a relatively small cell size. Additional exemplary solar cell technologies known in the art may also be utilized.

Figure 13A:
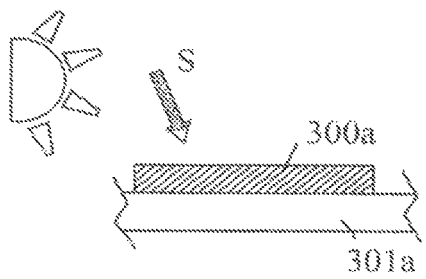
FIG. 13A is a schematic cross-sectional view of a solar powered variable light attenuating device assembled to an outer surface of a window.
Figure 13B:
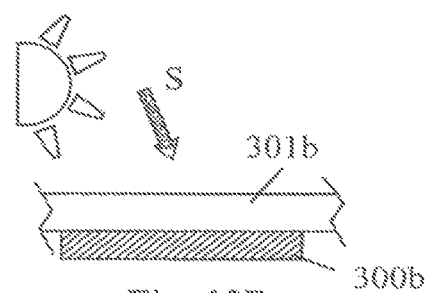
FIG. 13B is a schematic cross-sectional view of a solar powered variable light attenuating device assembled to an inner surface of a window.
Figure 13C:
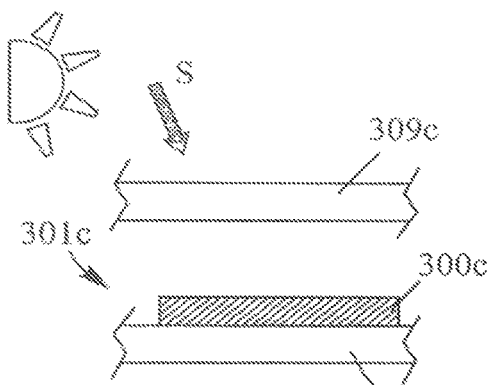
FIG. 13C is a schematic cross-sectional view of a solar powered variable light attenuating device assembled to an outer surface of an inner pane of a double pane window.
Figure 13D:
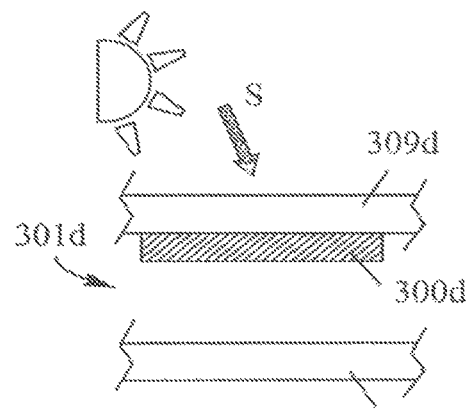
FIG. 13D is a schematic cross-sectional view of a solar powered variable light attenuating device assembled to an inner surface of an outer pane of a double pane window.

The above inventive features may be incorporated into building windows utilizing a variety of configurations and arrangements. As one example, a solar powered variable light attenuating device may be built into a window, for example, by securing (e.g., by lamination) the device 300a to an outer surface of a window 301a (see FIG. 13A), or by securing the device 300b to an inner surface of a window 301b (see FIG. 13B), or by securing the device 300c, 300d between panes 308c-d, 309c-d of a double paned window 301c, 301d (see FIGS. 13C and 13D). The device 300a-d may be configured to have a light concentrator positioned outward of a variable light attenuator (e.g., for increased solar power collection by a photovoltaic cell), as shown in FIGS. 6, 11A, 11B, and 12 and described above. Alternatively, the device 300a-d may be configured to have a light attenuator positioned outward of a light concentrator and solar cell, as shown in FIG. 7A, or outward of a solar cell only, as shown in FIG. 7B (e.g., for self modulation of the light attenuator and reduced voltage generation).

Figure 14:
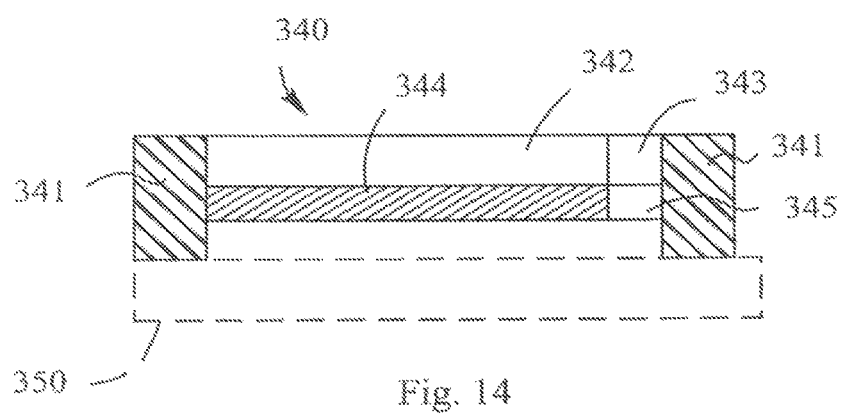
FIG. 14 is a schematic cross-sectional view of a solar powered variable light attenuating device kit for assembly with a window.

As another example, a solar power collecting and variable light attenuating liquid crystal cell arrangement or a variable light-attenuating device capable of having a clear, a dark and a translucent state, may be provided as a panel or kit for after-market installation (e.g. retrofitting) on an existing window in any of the configurations of FIGS. 13 A-13D. In one such example, a laminated panel incorporating the devices described herein may be provided with an adhesive on some or all of an inner surface of the film or panel for adhering the panel to a window. Alternatively, as shown schematically in FIG. 14, a panel or kit 340 may include an outer flange 341 at least partially surrounding a light concentrating film 342 and a variable light attenuating liquid crystal cell 344, with the flange 341 being configured to be fastened (directly or indirectly) to a window 350 or to a window frame, for example, by an adhesive or mechanical fasteners. In such an arrangement, the outer flange may provide additional thickness for supporting associated electronics, such as the photovoltaic cells 343 and/or control circuit 345. The flange may be provided in any suitable material, including, for example, an elastomer or foam material. Also, as discussed above, the kit may be provided with the light attenuating liquid crystal cell positioned outward of the light concentrating film (as shown in FIG. 3), without a light concentrating film (as shown in FIGS. 3 and 7B), or with a single layer or cell performing both light concentrating and light attenuating functions (as shown in FIG. 8).

Further, it is to be understood that a variety of optical elements may be assembled with light transmitting portions of a variety of devices and structures using one or more of the inventive features described in the present application. For example, such inventive features may be used with windows and sunroofs in vehicles or airplanes, as well as with devices such as protective or vision enhancing goggles or glasses or other protective eye shielding devices, such as helmet visors.

Example

One example of a device with a guest-host solution having three states can be achieved using the following materials and procedures. In this example, the guest-host mixtures includes a chiral liquid crystal material having positive dielectric anisotropy, a dichroic dye having positive dichroism, (i.e. having the least absorption in the homeotropic state and the most absorption in the planar/chiral state), a polymerizable material in sufficient concentration to stabilize the mixture, and an initiator for initiating the polymerization process. The mixture is disposed between a pair of substrates, at least one of which has a planar alignment layer.

In this example, "chiral liquid crystal host" refers to either a cholesteric liquid crystal or a nematic liquid crystal having a chiral dopant. In some examples, the pitch of the chiral component is selected to be longer than 850 nm. In some examples, the pitch is between 1-5 μm, or between 2-5 μm, or between 2-4 μm. Examples of stabilizing polymerizable materials for use in liquid crystal mixtures are known in the art and include, without limitation, mono or bi-functional acrylates or methacrylates or the like.

The cell described above may have some residual or inherent haze, which is the haze value measured when the cell is in the low-haze state. In certain applications (such as glasses, goggles or protective eye shields), the amount of haze is minimized for good optical transparency. In other applications, such as windows or sunroofs, etc., higher inherent haze values may be acceptable. In some examples, the haze value when the device is in a low-haze state is equal to or less than 0.5%, 1%, 2%, 3%, 3.5%, 4%, 5%, 6%, 7%, 8%, 9%, 10%, 15%, or 20%. The cell in a high-haze state can have a haze value that is higher than 15%, 20%, 25%, 30%, 40%, 50%, 60%, 70%, 80% or 90% up to 100%.

The above described mixture will have the following features (see FIG. 15 for one example): in the absence of a voltage (V=0), the liquid crystal (LC) molecules (and dyes) will have a planar-helical orientation, i.e. a low-haze, low-light transmission orientation with minimal or no scattering. When an intermediate voltage ($V=V_1$) is applied, the liquid crystal-dye mixtures will have a random or focal conic texture resulting in both absorption and scattering of light (i,e, the dye is in a high-haze light scattering orientation, the LC texture creating the "light scattering" geometry). When a higher or maximal voltage ($V=V_2$ or V=Vmax) is applied, the cell will become maximally "clear", i.e. the LC and the dissolved dye will have a homeotropic orientation resulting in a low-haze (i.e. minimal scattering), high light transmission orientation or state.

Figure 15:
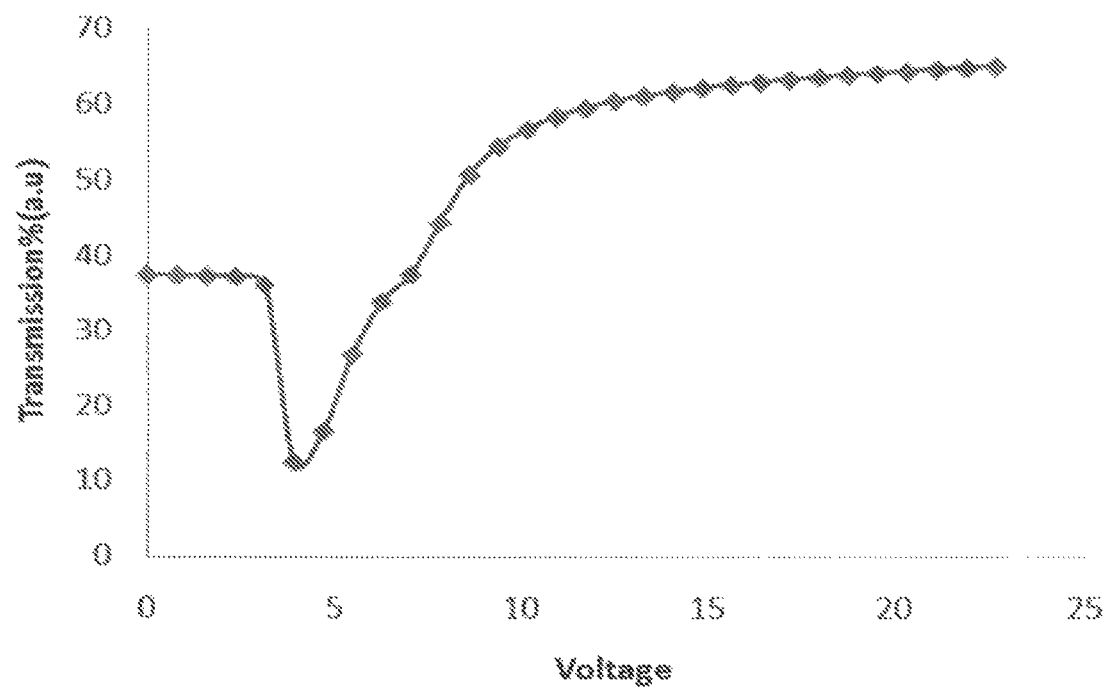
FIG. 15 is a graph showing % light transmission as a function of the voltage applied to a cell containing the mixture described in the Example.

To demonstrate the above features, a sample was prepared using 90.73% positive dielectric anisotropy liquid crystal HTG1352 (HCCH), 1.04% positive dye ZL01060 (AlphaMicron), 3.14% Chiral dopant R811 (Merck), 4.61% BMBB-6 (AlphaMicron) as monomer and 0.44% BME (Aldrich) as photo initiator. Chiral dopant R811 was mixed with liquid crystal HTG1352 to arrive at a cholesteric liquid crystal with a 3 μm pitch. The mixture was centrifuged and mixed a few times until it was uniform. A cell having substrates with an anti-parallel rubbed planar alignment layer and a 10 μm thickness was filled with the mixture. The cell was UV cured with intensity of 0.75 mw/cm^2 for 30 minutes. FIG. 15 shows a graph of results obtained with this mixture, the x-axis shows the voltage applied and the y-axis shows % light transmission through the cell.

We have found that only in the presence of the dichroic dye can the two low-haze states (non-scattering "clear" to non-scattering "tinted" states) be optically differentiated from each other. Good results may be obtained in the presence of a positive dichroic dye having a high dichroic ratio or order parameter (S) (e.g. S>0.65, 0.7, 0.75, 0.76, 0.77, 0.78, 0.79 or 0.8).

The substrates have a planar alignment layer and may be treated as follows: where no layer is rubbed; where one layer is rubbed, or where both layers are rubbed at an angle to each other (i.e. the rubbing direction of one substrate is at some angle to the rubbing direction of the other substrate, for example in an anti-parallel configuration where the angle is 180° C.).

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein, all such combinations and sub-combinations are intended to be within the scope of the present inventions. Still further, while various alternative embodiments as to the various aspects, concepts and features of the inventions—such as alternative materials, structures, configurations, methods, circuits, devices and components, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention.

What is claimed is:
1. A non-polarizer based variable light attenuating device comprising:
 a non-polarization based liquid crystal cell comprising first and second transparent substrates having first and second conducting layers provided thereon; and a guest-host solution comprising a liquid crystal and a dichroic dye disposed between the first and second conducting layers;

wherein the guest-host solution has a low-haze while the dye orientation alters between a low light transmitting orientation and a high light transmitting orientation in response to a first voltage supplied to the first and second conducting layers;

further wherein the guest-host solution is arranged in a droplet-sized light scattering orientation causing high-haze in response to a second voltage supplied to the first and second conducting layers and wherein the guest-host solution reverts to the low-haze state when no voltage is applied to the first and second conducting layers.

2. The device of claim 1, wherein the dye is substantially perpendicular to the first and second substrates when no voltage is supplied to the conducting layers and substantially parallel to the first and second substrates when the first voltage is supplied to the conducting layers.

3. The device of claim 1, wherein the dye is substantially parallel to the first and second substrates when no voltage is supplied to the conducting layers and substantially perpendicular to the first and second substrates when the first voltage is supplied to the conducting layers.

4. The device of claim 1, further comprising a control circuit for supplying a variable voltage to the first and second conducting layers.

5. The device of claim 4, further comprising a user interface to give a user complete or partial control over light transmittance through the device.

6. The device of claim 4, further comprising a photovoltaic cell configured to generate a voltage in response to light detected by the photovoltaic cell.

7. The device of claim 4, wherein the control circuit performs at least one of:
(a) control the first voltage to vary light transmission through the device automatically, in response to user manipulation of the control circuit, or a combination thereof;
(b) control the second voltage to vary light diffusion through the device automatically, in response to user manipulation of the control circuit, or a combination thereof;
(c) set a threshold level for supplying the first voltage automatically or as set by a user; and
(d) set a threshold level for supplying the second voltage automatically or as set by a user.

8. The device of claim 1, wherein at least one transparent substrate further comprises a luminescent dye that absorbs light at a first wavelength and emits light at a second wavelength different than the first wavelength.

9. The device of claim 1, wherein the guest-host solution further comprises a luminescent dye that absorbs light at a first wavelength and emits light at a second wavelength different than the first wavelength.

10. The device of claim 1, wherein the guest-host mixture comprises a positive dielectric anisotropy chiral liquid crystal host, a dichroic dye guest having positive dichroism, a polymerizable material and an initiator; and wherein at least one of the transparent substrates comprises a planar alignment layer.

11. The device of claim 10, wherein the chiral liquid crystal has a pitch longer than 850 nm.

12. The device of claim 1, wherein the device has a low-haze value that is equal to or less than 15%.

13. The device of claim 1, wherein the device has a high-haze value that is higher than 15%.

14. The device of claim 1, wherein said device is used with windows, goggles, glasses, or protective eye shielding devices.

15. The device of claim 1, wherein the chiral liquid crystal has a pitch between 2-5 µm.

16. A non-polarizer based variable light attenuating device comprising:
a non-polarization based liquid crystal cell comprising first and second conducting layers provided on first and second transparent substrates and a guest-host mixture disposed between said conducting layers,
wherein said guest-host mixture is in a low-haze low light-transmitting state when no voltage is applied to the cell; a low-haze high light-transmitting state when a first voltage is applied to the cell; and a focal conic light diffusing state to achieve high-haze when a second voltage is applied to the cell.

17. The device of claim 16, wherein the guest-host mixture comprises a positive dielectric anisotropy chiral liquid crystal host, a dichroic dye guest having positive dichroism, a polymerizable material and an initiator; and wherein at least one of the transparent substrates comprises a planar alignment layer.

18. The device of claim 17, wherein the chiral liquid crystal has a pitch longer than 850 nm.

19. The device of claim 16, wherein the guest-host mixture in a low-haze state has a haze value equal to or less than 15%.

20. A non-polarizer based variable light attenuating device comprising:
a non-polarization based liquid crystal cell comprising a guest-host mixture disposed between first and second conducting layers provided on first and second transparent substrates;
wherein at least one transparent substrate comprises a planar alignment layer;
wherein the guest-host mixture comprises a positive dielectric anisotropy chiral liquid crystal host having a pitch longer than 850 nm, a dichroic dye guest having positive dichroism, a polymerizable material and an initiator;
wherein in the absence of a voltage the liquid crystal host has a planar-helical orientation with minimal light scattering and the cell is in a low-haze high light-absorption state,
wherein when a first voltage is applied to the cell the liquid crystal has a light scattering focal conic orientation and the cell is in a high-haze state,
wherein when a second voltage is applied to the cell the liquid crystal has a homeotropic orientation with minimal light scattering and the cell is in a low-haze low-light absorption state.

21. The device of claim 20, further comprising a control circuit for supplying the first and second voltage to the liquid crystal cell.

22. The device of claim 20, wherein the chiral liquid crystal has a pitch between 2-5 µm.

* * * * *